(12) United States Patent
Timpe et al.

(10) Patent No.: US 6,569,609 B2
(45) Date of Patent: May 27, 2003

(54) PROCESS FOR DEVELOPING EXPOSED RADIATION-SENSITIVE PRINTING PLATE PRECURSORS

(75) Inventors: Hans-Joachim Timpe, Osterode (DE); Ulrich Fiebag, Nienstadt (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/075,661

(22) Filed: Feb. 14, 2002

(65) Prior Publication Data

US 2003/0082489 A1 May 1, 2003

Related U.S. Application Data

(62) Division of application No. 09/706,180, filed on Nov. 3, 2000.
(51) Int. Cl.[7] .................................................. G03F 7/30
(52) U.S. Cl. ....................................................... 430/399
(58) Field of Search ......................................... 430/399

(56) References Cited

U.S. PATENT DOCUMENTS

| 4,259,434 A | 3/1981 | Yamasue et al. ............ 430/302 |
| 4,469,776 A | 9/1984 | Matsumoto et al. ......... 430/309 |
| 4,577,948 A | * 3/1986 | Lawson et al. .............. 396/571 |
| 5,480,762 A | 1/1996 | Toyama et al. .............. 430/302 |
| 5,716,743 A | 2/1998 | Stein et al. .................... 430/30 |
| 5,837,425 A | 11/1998 | Nakanishi et al. .......... 430/302 |
| 5,851,735 A | 12/1998 | Miller et al. ................. 430/322 |
| 5,853,963 A | 12/1998 | Singh et al. ................. 430/399 |
| 6,143,479 A | 11/2000 | Fiebag et al. ................ 430/331 |

FOREIGN PATENT DOCUMENTS

| DE | 3291654 | | 6/1989 |
| EP | 0405986 | | 6/1990 |
| EP | 1037116 | | 3/2000 |
| GB | 2276729 | | 10/1994 |
| JP | 08044076 | * | 2/1996 |
| JP | 08082909 | * | 10/1997 |

* cited by examiner

*Primary Examiner*—Hoa Van Le
(74) *Attorney, Agent, or Firm*—RatnerPrestia

(57) ABSTRACT

A replenisher composition developing exposed radiation-sensitive printing plate precursors for plate/developer systems in which the electrical conductivity of the developer does not decrease to the same extend as the activity of the developer decreases or even increases is disclosed. A method for developing exposed radiation-sensitive printing plates using the replenisher composition is also disclosed.

17 Claims, No Drawings

PROCESS FOR DEVELOPING EXPOSED RADIATION-SENSITIVE PRINTING PLATE PRECURSORS

CROSS-REFERENCE TO RELATED APPLICATIONS

This application is a divisional application of Ser. No. 09/706,180, filed Nov. 3, 2000, now U.S. Pat. No. 6,391,530 B1, issued May 21, 2002, incorporated herein by reference.

FIELD OF THE INVENTION

This invention relates to a process for developing imagewise exposed radiation-sensitive devices, especially radiation-sensitive printing plates. In particular, it relates to a process for developing exposed radiation-sensitive devices where the efficiency of the partially exhausted alkaline developer is lower than it appears from the measured electrical conductivity. The invention also relates to a method for the production of a replenisher composition, and to its use as a replenisher composition for partially exhausted alkaline developers having a lower efficiency than it appears from the measured electrical conductivity.

BACKGROUND OF THE INVENTION

The art of lithographic printing is based upon the immiscibility of oil and water, in which oily material or ink is preferentially retained by the image areas and the water or fountain solution is preferentially retained by the non-image areas of the printing plate. When a suitably prepared surface is moistened with water and ink is applied, the background or non-image areas retain the water and repel the ink while the image areas accept the ink and repel the water. The ink on the image areas is then transferred to the surface of a material upon which the image is to be reproduced, such as paper, cloth, and plastic materials. Commonly, the ink is transferred to an intermediate material called the blanket, which in turn transfers the ink to the surface of the material upon which the image is to be reproduced.

Lithographic printing plates, sometimes known as printing plates precursors, can be either negative-working or positive-working, and comprise one or more radiation-sensitive layers on a suitable substrate, such as metal or polymeric support. The radiation-sensitive layer generally includes one or more radiation-sensitive components that may be dispersed in a suitable binder. Alternatively, the radiation-sensitive component can also be the binder material.

In order to obtain a printing plate with imagewise distribution of printable areas, it is necessary to remove the non-image areas of an exposed printing plate precursor. The most common method for removing the undesired areas is to contact the exposed precursor with a developer solution.

A negative-working printing plate generally has a light sensitive layer composed of a radiation-sensitive component such as an unsaturated resin, a negative diazo resin dissolved in a polymeric binder, or an initiator system together with monomers and/or oligomers, on a suitable substrate. Upon exposure to light, the exposed areas are hardened, leaving non-exposed areas removable during development. Certain negative-working printing plates contain novolac resins, a cross-linking agent, and a radiation-sensitive component that produces acid on exposure. By subsequently heating the plate, only the exposed areas are cured and the unexposed areas can be removed by a developer. The exposed, hardened areas are therefore oleophilic and will accept ink while the non-exposed underlying areas of the substrate are hydrophilic.

Many alkaline developable positive-working printing plates generally have a light sensitive layer comprising a novolac resin and a radiation-sensitive component such as an o-diazoquinone or diazonaphthoquinone compound. Upon exposure to light the radiation-sensitive component is converted to the corresponding carboxylic acid. The use of an alkaline developer will remove only the exposed areas of the radiation-sensitive layer, leaving the surface of the support. Because the surface of the support is hydrophilic, the uncovered non-image area attracts water and repels the oily ink. The image area remaining after development is oleophilic thereby repelling water and attracting the printing ink.

Various aqueous solutions are known for use as developers. Yamasue, U.S. Pat. No. 4,259,434, describes use of a dispersion of a silicate to develop positive-working printing plates. These solutions include alkali metal silicates, in which the ratio of $SiO_2$ to $M_2O$ is from 0.5 to 0.75 ("M" being the alkali metal) at 1–4% $SiO_2$ concentration.

Seino, U.S. Pat. No. 4,452,880 describes silicate-containing developers in which the $SiO_2$ to alkali metal oxide ratios are much higher, that is between 1.6 and 2.0, and the % $SiO_2$ concentration is from 2 to 9%.

Miller, U.S. Pat. No. 5,851,735, discloses an aqueous alkaline developing composition that is useful in developing either positive-working or negative-working lithographic printing plates. The composition has a pH of at least 12 and comprises an alkali metal silicate and at least 6 wt % of a water-soluble or water-dispersible thickener, such as glycerol.

Toyama, GB-A-2,276,729 (DE-A-4 411 176) discloses a developer or replenisher composition for both positive-working and negative-working lithographic printing plates comprising an alkali metal silicate and a water-soluble ethylene oxide adduct, obtained by addition of ethylene oxide to a sugar alcohol having not less than 4 hydroxy groups. This developer is stable and shows a high developing efficiency.

During development of exposed printing plate precursors, the developer is weakened as the throughput (i.e., $m^2$ of the exposed printing plate precursors) increases. For alkaline developers, the alkalinity of the developer decreases as additional exposed precursors are developed. The weakening of the developer leads to a darker or fuller image reproduction, which does not meet the requirements for a standardized printing. In the case of conventional printing plates, i.e. plates that are imagewise exposed to radiation through a mask, the change of efficiency of the developer and, therefore, of the image reproduction can be monitored by simultaneously copying test elements.

However, this is not possible for digital plates directly exposed by a laser without using a mask. If the developer has a measurable electrical conductivity, as is usually the case with aqueous alkaline developers, the users often monitor the electrical conductivity of the developer during the development process to determine the efficiency of the developer. As soon as a weakening of the developer efficiency is established by means of a lower electrical conductivity, the developer is refreshed by adding either fresh developer or a so-called replenisher composition that has a higher concentration of hydroxide ions than the developer, to the weakened developer until the electrical conductivity of the developer again reaches its original value.

As described in EP-A-0 556 690, the electrical conductivity of a developer does not always decrease when the alkalinity decreases during the development process.

Depending on the kind of developer system and also on the kind of plate being developed, the electrical conductivity of the developer may be constant, may increase, or may decrease, even though the efficiency of the developer decreases in each case. According to one theory, it is assumed that ingredients of the removed radiation-sensitive layer of the developed printing plates and/or side reactions are responsible for the production of new ions. These ions at least partially compensate or even overcompensate the loss of electrical conductivity due to consumption of hydroxide ions (OH⁻) of the developer, thus producing a measured electrical conductivity that is not as low as it would be expected due to the consumption of hydroxide ions by the developing process. Measuring the electrical conductivity does therefore not in every case allow a conclusion on the efficiency (i.e. activity) of the developer. Constant conductivity values therefore do not guarantee the constant developer activity required for the desired constant developing result. If there is a developer system and/or plate where the activity of the developer decreases while the electrical conductivity only slightly decreases, keeps constant or even increases the addition of a highly alkaline replenisher composition for increasing the activity results in an increase of the electrical conductivity.

EP-A-0 556 690 discloses a computer controlled system for refreshing the partially exhausted developer for those cases where the value of the electrical conductivity is not a measure for the activity of the developer. However, this system requires that printers purchase an expensive computer-controlled system.

Therefore, there is a need for a process that does not require expensive new equipment, that can easily used by printers, and does not require skilled workers fir its operation.

SUMMARY OF THE INVENTION

The invention provides a simple method for the production of a replenisher composition useful for refreshing an at least partially exhausted developer having a lower activity than it appears from the electrical conductivity of the developer. The method comprises the steps of:

(a) measuring the activity and electrical conductivity of the developer as a function of the unit throughput of a device:

(b) determining the amount of hydroxide ions per unit throughput necessary to maintain the original activity of the developer;

(c) determining the amount of a electrical conductivity suppressing agent per unit throughput necessary to keep the electrical conductivity constant; and (d) preparing the replenisher composition by mixing water, a hydroxide ion source, and the electrical conductivity suppressing agent;

in which:
the device comprises a radiation-sensitive layer;
the electrical conductivity suppressing agent is water soluble, does not react with the other components of the replenisher composition and the developer, and does not react with or attack the radiation-sensitive layer of the device; and
the replenisher composition has a pH of about 10 to about 14.

The invention also provides a method for developing radiation-sensitive imagewise exposed devices by using an alkaline developer showing electrical conductivity comprising the steps of:

(A) placing the exposed devices in the alkaline developer and removing the devices after a predetermined dwell time; and (B) correcting the activity of the developer to maintain the original activity of the developer by adding a replenisher composition to the developer;

in which the replenisher composition is prepared by the steps of:

(a) measuring the activity and electrical conductivity of the developer as a function of the unit throughput of the exposed device:

(b) determining the amount of hydroxide ions per unit throughput necessary to maintain the original activity of the developer;

(c) determining the amount of a electrical conductivity suppressing agent per unit throughput necessary to keep the electrical conductivity constant; and (d) preparing the replenisher composition by mixing water, a hydroxide ion source, and the electrical conductivity suppressing agent;

in which:
the device comprises a radiation-sensitive layer; and
the electrical conductivity suppressing agent is water soluble, does not react with the other components of the replenisher composition and the developer, and does not react with or attack the radiation-sensitive layer of the device.

DETAILED DESCRIPTION OF THE INVENTION

The invention deals with the problem of different behavior of electrical conductivity of a developer and its activity, especially the case that the electrical conductivity does not decrease to the same extend as the activity decreases when developing a plurality of devices. The method provided herewith allows the developing of exposed radiation-sensitive devices, such as lithographic printing plates, with constant activity of the developer without the need of a computer-controlled system. According to the invention a partially exhausted alkaline developer is refreshed by the addition of a strong alkaline replenisher composition which comprises an agent capable of suppressing the electrical conductivity of the developer to some extend.

According to the method of the invention the activity and the electrical conductivity of the developer are measured as a function of the unit throughput of the device being processed. Unit throughput can for measured in, for example, area (i.e. square meters of device processed) or, in the case in which the devices are essentially uniform, the number of devices processed of a certain size. The activity of the developer refers to the alkalinity of the developer, which is usually determined by titration with HCl (for instance 0.5 N HCl).

From the correlation of activity with unit throughput, the amount of hydroxide ion per unit throughput necessary to maintain constant activity can be calculated. For lithographic printing plates, the replenisher composition used for adding the needed amount of hydroxide ions preferably contains a hydroxide ion source selected from the group consisting of alkali metal hydroxides, alkali metal silicates, water glass, and alkali metal phosphates and mixtures thereof in a concentration that about 25 to 200 mL, preferably 30 to 60 mL, of replenisher composition per m² of developed printing plate are sufficient for replacing the consumed hydroxide ions in the developer. Less than about 25 mL per m² of developed printing plate is not preferred.

About 25 mL of developer are removed from the developing bath with the plate per m² of developed printing plate, and the content of the developer bath should be kept approximately constant. An amount higher than about 100 mL is not preferred from an economical point of view because by doing so the amount of waste drastically increases.

In a preferred embodiment, a constant amount of replenisher composition is added after every processed device. In a continuous developing process it is, however, also possible to add a different amount of replenisher composition after a different amount of processed device, as long as the amount of replenisher composition added is proportional to the throughput, for instance doubled if the throughput is doubled.

The starting developer can but does not necessarily contain the suppressing agent. According to one embodiment of the invention, the starting developer also contains the electrical conductivity suppressing agent used in the replenisher composition, however, in a much lower concentration, for example 0.15 to 0.5 times of the concentration used in the replenisher composition, more preferred 0.2 to 0.3 times.

The electrical conductivity suppressing agent is a polar organic substance that is water soluble. Furthermore, it has to be inert, i.e. it neither reacts with either the other components of the replenisher composition or the developer nor reacts with or attacks the radiation-sensitive layer of the device to be developed.

The electrical conductivity suppressing agent is preferably selected from glycerol, diols, mono- or diethers of diols, esters of diol monoethers, ketones substituted with at least one hydroxy group and/or alkoxy group, ethers, alkanol amines, alkanols and amides of organic acids. Examples for suitable diols are for instance those represented by the following formula:

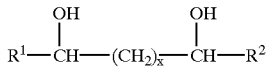

in which x is zero or an integer from 1 to 4, and $R^1$ and $R^2$ are each independently selected from hydrogen and $C_1$–$C_3$ alkyl. Especially preferred diols are ethylene glycol; hexylene glycol; hexane-1,6-diol; propane-1,3-diol; and butane-1,4-diol.

Also suitable are mono- and diethers obtained from said diols and $C_1$–$C_4$ alkanols, such as methoxy propanol and 1,2-dimethoxyethane (ethylene glycol dimethyl ether). The monoethers can additionally be esterified with an organic acid selected from formic acid and acetic acid. Other suitable electrical conductivity suppressing agents are ketones substituted with at least one hydroxy group and/or alkoxy group like methoxyacetone and diacetone alcohol.

Ethers of the following formula are further examples of suitable electrical conductivity suppressing agents

in which $R^3$ and $R^4$ are independently selected from alkyl groups having 1 to 4 carbon atoms.

Especially preferred are cyclic ethers, i.e. ethers in which $R^3$ and $R^4$ together with the oxygen atom to which they are bonded form a 5 or 6-membered ring, and 1,4-dioxane Preferably the ether is selected from the group consisting of 1,4-dioxane, methyl butyl ether, tetrahydrofuran and mixtures thereof.

Examples of suitable alkanol amines are those represented by the following formula:

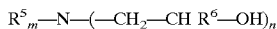

in which m is 0, 1 or 2, n is 1, 2 or 3, m+n=3, $R^5$ and $R^6$ are each independently H or $C_1$–$C_2$ alkyl. Especially preferred are monoethanol amine, diethanolamine, mono(iso-propanol)amine and tri(iso-propanol)amine.

$C_3$–$C_6$-Alkanols can also be used. The alkyl moiety can be a straight chain or branched chain alkyl as well as a cycloalkyl. The hydroxy group may be bonded to a terminal carbon atom or may be bonded to a carbon atom within the carbon skeleton. Suitable examples are 2-butanol and iso-propyl alcohol. Furthermore, the $C_3$–$C_6$ alkanols may further contain an amino group —$NH_2$; examples thereof are ethanolamine and propanolamine.

In addition, amides of organic acids represented by the following formula can be used as electrical conductivity suppressing agents:

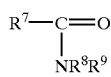

in which $R^7$ is selected from hydrogen, methyl or ethyl, $R^8$ and $R^9$ are each independently H or $C_1$–$C_3$ alkyl.

Ethylene glycol and hexane-1,6-diol are especially preferred suppressing agent.

The type of suppressing agent useful for a certain developing process depends—beside other factors—from the kind of radiation-sensitive layer on the device to be developed since it is important that the suppressing agent does not attack said layer. The amount of the electrical conductivity suppressing agent in the replenisher composition depends on the developer composition as well as the kind of radiation sensitive layer to be developed. In most cases the amount is suitably in the range of about 2 to about 15 wt % based on the total replenisher composition, more preferably from about 4 to about 11 wt %.

In addition to the electrical conductivity suppressing agent, the replenisher composition comprises water and at least one component selected from the group consisting of: alkali metal hydroxides (like lithium hydroxide, sodium hydroxide, potassium hydroxide and ammonium hydroxide), alkali metal metasilicates, water glass, alkali metal phosphates, alkali metal carbonates and hydrogen carbonates, or alkali metal borates in order to provide sufficient alkalinity. In order to be able to increase the alkalinity of a partially exhausted developer it is necessary that the amount of the hydroxide, metasilicate, water glass, phosphates, carbonates, hydrogen carbonates and/or borates in the replenisher composition is distinctly higher than in the developer. Preferably the amount in the replenisher composition is 1.2 to 1.6 times as high as in the developer. It is preferred that the alkalinity of the replenisher composition is 1.2 to 1.6 times as high as that of the original developer; furthermore, the electrical conductivity of the replenisher composition is preferably also higher than that of the original developer (e.g. 1.1 to 1.5 times as high as that of the original developer).

Optionally the replenisher composition further comprises at least one member selected from the group consisting of: surfactants, etch inhibitors, antifoaming agents, chelating agents and biocides.

Examples of chelating agents include polyphosphoric acids and their sodium, potassium and ammonium salts; aminopolycarboxylic acids, such as ethylenediaminetetraacetic acid, diethylenetriaminepentaacetic acid, triethylenetetraamine-hexaacetic acid, hydroxyethylethylenediaminetriacetic acid, nitrilotriacetic acid, 1,2-diaminocyclohexanetetraacetic acid, 1,3-diamino-2-propanoltetraacetic acid, etc., and their sodium, potassium and ammonium salts; aminotri(methylenephosphonic acid), ethylenediaminetetra(methylenephosphonic acid), diethylenetriamine-penta(methylenephosphonic acid), triethylenetetraminehexa(methylenephosphonic acid), hydroxyethylethylenediaminetri(methylenephosphonic acid) and 1-hydroxyethane-1,1-diphosphonic acid, and their sodium, potassium and ammonium salts.

Preferred chelating agents which simultaneously also act as etch inhibitors are phoshonic acid derivatives like those represented by the formula:

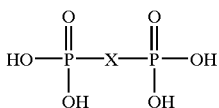

in which X is $C_2$–$C_6$ alkylene or

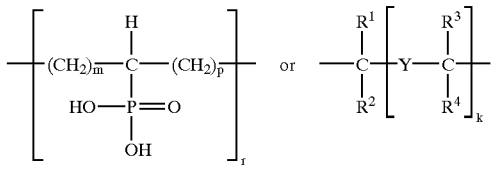

in which k=0 or 1; m=1, 2, 3; p=1, 2, 3; r is an integer from 10–20; $R^{10}$ and $R^{11}$ are each independently H or $C_1$–$C_4$ alkyl; $R^{12}$ and $R^{13}$ are each independently H, OH or $C_1$–$C_4$ alkoxy; and Y is —$R^9$N—$(CH_2)_n$—$(NR^8)_q$—, in which q=0 or 1, n is an integer from 0 to 8 and $R^8$ and $R^9$ are each independently H, $C_1$–$C_4$ alkyl or —$CH_2$—$P(O)(OH)_2$. Especially preferred are hydroxyethane diphosphonic acid, aminotri(methylene-phosphonic acid), hexamethylene diaminotetra(methylenephosphonic acid), sodium salts thereof, and mixtures thereof.

The amount of the chelating agent or mixture of the chelating agents is from 0 to 5 wt % based on the total composition of the replenisher composition.

Examples of the surfactant that can be used include nonionic surfactants, such as polyoxyethylene alkyl ethers, polyoxyethylene alkyl phenyl ethers, polyoxyethylene polystyryl phenyl ethers, polyoxyethylenepolyoxypropylene alkyl ethers, glycerin fatty acid partial esters, sorbitan fatty acid partial esters, pentaerythritol fatty acid partial esters, propylene glycol monofatty acid esters, cane sugar fatty acid partial esters, polyoxyethylenesorbitan fatty acid partial esters, polyoxyethylenesorbitol fatty acid partial esters, polyethylene glycol fatty acid esters, polyglycerin fatty acid partial esters, polyoxyethylenized castor oils, polyoxyethyleneglycerin fatty acid partial esters, fatty acid diethanolamides, N,N-bis-2-hydroxyalkylamines, polyoxyethylene alkylamines, triethanolamine fatty acid esters, and trialkylamine oxides; anionic surfactants, such as fatty acid salts, abietic acid salts, hydroxyalkanesulfonic acid salts, alkanesulfonic acid salts, dialkylsulfosuccinic acid esters, straight-chain alkylbenzenesulfonic acid salts, branched alkylbenzenesulfonic acid salts, alkylnaphthalenesulfonic acid salts, alkyl-phenoxypolyoxyethylenepropylsulfonic acid salts, polyoxyethylene alkyl sulfophenyl ethers, N-methyl-N-oleyltaurin sodium salt, N-alkylsulfosuccinic acid monoamide di-sodium salts, petroleum sulfonic acid salts, sulfated beef-tallow oil, sulfates of fatty acid alkyl esters, alkylsulfuric acid esters, polyoxyethylene alkyl ether sulfuric acid esters, fatty acid monoglyceride sulfuric acid esters, polyoxyethylene alkyl phenyl ether sulfuric acid esters, polyoxyethylene styryl phenyl ether sulfuric acid esters, alkylphosphoric acid esters, polyoxyethylene alkyl ether phosphoric acid esters, polyoxyethylene alkyl phenyl ether phosphoric acid esters, partially saponified styrene/maleic anhydride copolymers, partially saponified olefin/maleic anhydride copolymers, and formaldehyde condensates of naphthalenesulfonates; cationic surfactants such as alkylamine salts, quaternary ammonium salts, polyoxyethylene alkylamine salts, and polyethylene polyamine derivatives, and amphoteric surfactants, such as carboxybetaines, amino-carboxylic acids, sulfobetaines, aminosulfuric acid esters, and imidazolines. The polyoxyethylene moiety present in some of the above-cited surfactants can be replaced by a polyoxypropylene, polyoxybutylene or another polyoxyalkylene moiety, and the resulting surfactants also can be included. Further suitable surfactants are fluorinated surfactants in which a perfluoroalkyl group is present. Examples of such fluorinated surfactants include anionic ones, such as perfluoroalkylcarboxylic acid salts, perfluoroalkylsulfonic acid salts, perfluoroalkylphosphoric acid esters, etc.; amphoteric ones, such as perfluoroalkylbetaines, etc.; cationic ones, such as perfluoroalkyltrimethylammonium salts, etc.; and nonionic ones, such as perfluoroalkylamine oxides, perfluoroalkylethylene oxide adducts, oligomers containing perfluoroalkyl and hydrophilic groups, oligomers containing perfluoroalkyl and lipophilic groups, oligomers containing perfluoroalkyl, hydrophilic and lipophilic groups, and urethanes containing perfluoroalkyl and lipophilic groups. Preferred surfactants are sulfonic acid salts, sulfuric acid esters and compounds containing perfluoroalkyl groups.

The surfactant can be used alone or as a mixture of two or more thereof. The concentration of such a surfactant in the replenisher composition is generally from 0 to 10% by weight, preferably from 0.01 to 5% by weight.

Further, the replenisher composition can further contain one or more antifoaming agent if desired. Suitable antifoaming agents are, for instance, polydimethylsiloxanes or their copolymers. They are used in an amount of 0 to 1 wt % based on the total replenisher composition, more preferably of 0.01 to 0.5 wt %.

Examples of suitable etch inhibitors are for instance

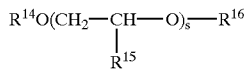

in which $R^4$ is hydrogen or $C_1$–$C_4$ alkyl; $R^{15}$ is hydrogen, methyl or ethyl; $R^{16}$ is hydrogen or $CH_2COOH$; and s is an integer from 10 to 20.

They are used in an amount of 0 to 3 wt % based on the total weight of the replenisher composition, preferably 0.001 to 0.6 wt %. Further suitable etch inhibitors are alkali metal phosphates and polyphosphates, and phosphonates.

In an especially preferred embodiment of the invention, a replenisher composition is used that comprises:
 (a) at least one of alkali metal hydroxide and water glass,
 (b) at least one phosphonic acid derivative selected from hydroxyethanediphosphonic acid, aminotri(methylenephosphonic acid), hexamethylenediaminotetra(methylenephosphonic acid), sodium salts thereof, and mixtures thereof,
 (c) at least one polyglycol derivative selected from polypropylene glycol ether, polyethylene glycol ether, polybutylene glycol ether, derivatives thereof, and mixtures thereof, and (d) 8–15 wt % based on the total weight of the replenisher composition of a electrical conductivity suppressing agent selected from ethylene glycol and hexane-1,6diol, and diacetone alcohol.

INDUSTRIAL APPLICABILITY

The method is especially suitable for developing positive-working thermal plates, especially those comprising a radiation-sensitive layer comprising:

(a) at least one polymeric substance, which is a phenolic resin soluble in an aqueous developer;

(b) at least one compound which reduces the developer solubility of the polymeric, substance, typically selected from imidazolium compounds, quinolinium compounds, benzothiazolium compounds and pyridinium compounds, with quinolinium compounds being preferred; and (c) at least one compound which is capable of absorbing radiation and converting it to heat, preferably selected from dyes and pigments of the following classes: squarylium, merocyanine, indolizine, pyrylium and metal dithioline.

Such printing plates are described in EP-B-0 825 927 and Parsons, U.S. Pat. No. 6,280,899, both of which are incorporated herein by reference. Specialized equipment is not required. Any commonly used developing equipment can be used to carry out the process of the invention.

The advantageous properties of this invention can be observed by reference to the following examples, which illustrate but do not limit, the invention.

EXAMPLES

Glossary

| | |
|---|---|
| REWOTERIC ® AM-V | Wetting agent (Witco) |
| Sequion 10 Na | Sodium salt of hydroxyethane diphosphonic acid (Polygon) |
| SYNPERONIC ® T 304 | Nonionic surfactant obtained by polycondensation of propylene oxide and ethylene oxide on ethylene diamine (Uniqema, Wilmington, DE) |
| TRILON ® B chelating agent | Tetra sodium ethylenediamine tetraacetic acid (BASF, Ludwigshafen, Germany) |

Example 1
Preparation of Replenisher Composition 1

A replenisher composition was prepared from the following components under stirring:

| | |
|---|---|
| 69.7 kg | water |
| 19.1 kg | potassium hydroxide solution 45 wt % in water |
| 2.1 kg | phosphoric acid 85 wt % in water |
| 6.1 kg | potassium waterglass 42/43 degrees Be in water |
| 13 kg | ethylene glycol |
| 0.21 kg | REWOTERIC ® AM-V |
| 0.21 kg | Sequion 10 Na |
| 0.24 kg | SYNPERONIC ® T 304 |

The mixture was subsequently filtered and stored in a closed container prior to use.

Example 2
Preparation of Replenisher Composition 2

A replenisher composition was prepared from the following components under stirring:

| | |
|---|---|
| 74 kg | water |
| 11.0 kg | sodium hydroxide solution 50 wt % in water |
| 2.0 kg | phosphoric acid 85 wt % in water |
| 8.6 kg | sodium waterglass 37/40 degrees Be in water |
| 3.7 kg | hexane-1,6-diol |
| 0.18 kg | Trilon ® B (tetrasodium salt of EDTA, available from BASF) |
| 0.14 kg | Synperonic T 304 |

The mixture was subsequently filtered and stored in a closed container prior to use.

Reference Example 1
Preparation of Developer 1

A developer was prepared from the following components under stirring:

| | |
|---|---|
| 40.9 kg | water |
| 5.8 kg | potassium hydroxide solution 45 wt % in water |
| 1.1 kg | phosphoric acid 85 wt % in water |
| 3.2 kg | potassium waterglass 42/43 degrees Be in water |
| 1.5 kg | glycerol |
| 0.1 kg | REWOTERIC ® AM-V |
| 0.1 kg | Sequion 10 Na |
| 0.12 kg | SYNPERONIC ® T 304 |

The mixture was subsequently filtered and stored in a closed container prior to use.

Reference Example 2
Preparation of Developer 2

A developer was prepared from the following components under stirring:

| | |
|---|---|
| 41.3 kg | water |
| 3.8 kg | sodium hydroxide solution 50 wt % in water |
| 1.1 kg | phosphoric acid 85 wt % in water |
| 4.8 kg | sodium waterglass 37/40 degrees Be in water |
| 0.9 kg | hexane-1,6-diol |
| 0.1 kg | TRILON ® B |
| 0.08 kg | SYNPERONIC ® T 304 |

The mixture was subsequently filtered and stored in a closed container prior to use.

Reference Example 3
Preparation of Developer 3

A developer was prepared following the procedure used to prepare Developer 1, except that no glycerol was present and 42.4 kg water were used instead of 40.9 kg.

Comparative Example 1
Preparation of Comparative Replenisher Composition 1

A replenisher composition was prepared from the following components under stirring:

| | |
|---|---|
| 72.3 kg | water |
| 19.1 kg | potassium hydroxide solution 45 wt % in water |
| 2.1 kg | phosphoric acid 85 wt % in water |

-continued

| | |
|---|---|
| 6.1 kg | potassium waterglass 42/43 degrees Be in water |
| 0.21 kg | REWOTERIC ® AM-V |
| 0.21 kg | Sequion 10 Na |
| 0.24 kg | SYNPERONIC ® T 304 |

The mixture was subsequently filtered and stored in a closed container prior to use.

Comparative Example 2

Preparation of Comparative Replenisher Composition 2

A replenisher composition was prepared following the procedure used to prepare Replenisher composition 1 except that no ethylene glycol was present and 82.7 kg water were used instead of 69.7 kg.

Example 3

Developing of Positive-Working Thermal Plate

The positive-working printing plate ELECTRA® used in the following examples is available from Kodak Polychrome Graphics LLC. ELECTRA® plates were cut to a size of 515×790 mm and exposed in the IR-exposure unit Trendsetter 3244 (from Creo/Heidelberg) using an energy of 10 W and a rotational speed of the drum of 180 rpm. The Kodak Professional Colorflow Strip (available from Eastman Kodak), which contains different elements for evaluating the quality of the copies, was used for evaluation.

A commercially available processor (Sprinter; Kodak Polychrome Graphics LLC), equipped with an immersion type developing bath, a section for rinsing with water, and a gumming and drying section, was used to develop the imagewise exposed plates. The processor was filled with 20L of the appropriate developer. Separately, a container for the replenisher composition was attached from which a predetermined amount of replenisher composition per square meter of developed plate was added to the developing bath via a pump.

The following other processor parameters were kept constant in all tests:

| | |
|---|---|
| temperature of the developing bath | $(23 \pm 1)^\circ$ C. |
| dwell time in the developer | 45 sec |

The electrical conductivity of the developing bath was monitored by a separately mounted electrical conductivity measuring unit of the type Conductivity Monitor (Unigraph). To determine the activity (i.e. the alkali content) 10 mL of the developer were removed from the developing bath, 90 mL deionized water were added, and titration was carried out with 0.5 N HCl (Titrino DMS 716. Metrohm). The number of mL used to reach the first equivalence point is referred to as alkali value.

To evaluate the copies obtained after development, the following criteria were examined: reproduction of the 1 and 2 pixel elements, optical density (OD) of the checkerboard dots of the pixel elements (measured with the apparatus D 19C/D 196, from Gretag/Macbeth).

Stability and Load Tests

ELECTRA® plates exposed in the manner described above were developed one after another at a rate of 33 plates per day for 30 days (plus 5 weekend interruptions) in the Sprinter processor. The quality of the resulting copies was evaluated in terms of the criteria given above. At a throughput of 2 $m^2$/L the electrical conductivity was measured as well as the activity (by titration with 0.5 N HCl).

The results for Replenisher Composition 1 and Developer 1 are listed in Table 1 below. The titration and electrical conductivity data show that the electrical conductivity as well as the activity of the developer can be kept constant during the long testing period by the addition of replenisher composition in the amount of 50 mL per $m^2$ of developed plate. This also becomes apparent in the almost constant values for the copy parameters after the development of 400 $m^2$ dots of 1×1 pixel elements were open independently from the throughput.

During the test period of 12 L of overflow of used developer was collected, which corresponds to about 30 mL/$m^2$ of processed printing plates. No formation of foam or precipitation was observed during the testing period. After the test was completed, the processor could be easily cleaned by rinsing with water, and no residue remained.

Neither ink acceptance nor toning problems occurred in printing tests of plates after different throughputs.

The procedure was repeated with ELECTRA® plates and Developer 2 and Replenisher Composition 2. It was found that by adding 49 mL of replenisher composition 2, the activity of the developer could be kept constant until the end of the testing of 18 $m^2$/L (electrical conductivity: 52.6 mS/cm; titration: 7.8 mL). Also, the copy parameters of OD=95 for 95% dot screen and OD=49 for 59% dot screen in the beginning only slightly changed to OD=96 and OD=51, respectively. after a plate throughput of 18 $m^2$/L. Plates developed with such a developing system showed no problems in ink acceptance or toning during the printing test at the print proof and upon restarting.

TABLE 1

| Through-put ($m^2$/L) | Replenisher composition (mL/$m^2$) | Optical Density (95% dot) | Optical Density (50% dot) | Electrical conductivity (mS/cm) | Titration (mL 0.5 N HCl) |
|---|---|---|---|---|---|
| 0 |  | 95 | 51 | 72.9 | 8.9 |
| 2 | 50 | 96 | 50 | 72.7 | 8.8 |
| 4 | 50 | 95 | 51 | 72.6 | 8.5 |
| 6 | 50 | 96 | 50 | 72.4 | 8.5 |
| 8 | 50 | 95 | 50 | 72.8 | 8.6 |
| 10 | 50 | 95 | 51 | 72.9 | 8.7 |
| 12 | 50 | 96 | 51 | 72.5 | 8.4 |
| 14 | 50 | 95 | 50 | 72.8 | 8.5 |
| 16 | 50 | 95 | 51 | 72.6 | 8.4 |
| 18 | 50 | 96 | 51 | 72.4 | 8.6 |
| 20 | 50 | 96 | 50 | 72.5 | 8.4 |

Example 4

Influence of Organic Compounds on the Electrical Conductivity of Replenisher Compositions A replenisher composition was prepared from the following components under stirring:

| | |
|---|---|
| 7.0 kg | water |
| 2.0 kg | potassium hydroxide solution 45 wt % in water |
| 0.2 kg | phosphoric acid 85 wt % in water |
| 0.6 kg | potassium waterglass 42/43 degrees Be in water |
| 0.02 kg | REWOTERIC ® AM-V |
| 0.02 kg | Sequion 10 Na |
| 0.02 kg | SYNPERONIC ® T 304 |

The electrical conductivity of this solution was monitored by a electrical conductivity measuring unit of the type Conductivity Monitor (Unigraph). The electrical conductivity of this solution was 180 mS/cm. By addition of definitive amounts of compounds listed in Table 2 several solutions, containing different wt % of these compounds, were prepared, and their electrical conductivity was measured by the same way. The results are given in Table 2. It is shown that all used polar organic compounds depress the electrical conductivity of the replenisher composition, however, to a different extent.

parameter, however, increased with the number of loaded plates. Due to the constant developer activity, the plate quality parameters also remain constant (see Table 4 below). As is apparent from Tables 3 and 4 it is not possible to infer the activity of the developer from the measurement of the electrical conductivity.

TABLE 2

| Added Amount (wt %) | Water | Ethylene glycol | Iso-propanol | Dimethyl formatted | Hexylene glycol | Diethylene glycol | Phenyl glycol |
|---|---|---|---|---|---|---|---|
| 5 | 174.0 | 144.0 | 145.2 | 146.6 | 146.9 | 144.6 | 162.0 |
| 10 | 165.8 | 121.4 | 119.6 | 122.4 | 119.2 | 121.1 | 147.6 |
| 15 | 158.5 | 103.2 | 100.3 | 98.4 | 96.8 | 99.3 | 131.2 |
| 20 | 151.9 | 90.7 | 88.6 | 78.8 | 83.6 | 80.6 | 124.6 |
| 25 | 144.7 | 80.3 | 74.5 | 59.5 | 69.1 | 65.8 | 109.3 |
| 30 | 136.1 | 71.6 | 69.1 | 44.9 | 56.5 | 52.7 | 96.4 |

| Added Amount (wt %) | Hexane diol-1.6 | Mono-ethanol amine | 2-Methoxy ethyl acetate | Methoxy Acetone | 1.2-Di-methoxy ethane | 1.4-Dioxane | Poly glycol 2000 | Glycerol |
|---|---|---|---|---|---|---|---|---|
| 5 | 165.1 | 143.5 | 109.2 | 144.5 | 143.8 | 167.7 | 146.4 | 145.3 |
| 10 | 133.6 | 114.3 | 71.4 | 120.4 | 125.2 | 139.7 | 128.0 | 125.5 |
| 15 | 114.1 | 91.6 | 61.8 | 99.9 | 90.5 | 113.5 | 107.5 | 111.6 |
| 20 | 94.9 | 72.9 | * | 76.1 | 68.4 | 91.1 | * | 95.1 |
| 25 | 79.8 | 53.6 | * | 58.2 | 40.6 | 72.4 | * | 84.7 |
| 30 | 65.0 | 41.7 | * | 56.8 | 23.9 | 50.4 | * | 75.9 |

*Added amount not soluble in the replenisher composition

Comparative Example 3

Stability and Load Tests with Compositions of Comparative Example 1

ELECTRA® plates were developed in the same manner as described above in the developing processor with Developer 3 and the replenisher composition listed in Comparative Example 1. Compared to Replenisher Composition 1, this replenisher composition contains no conductivity suppressing agent. The procedures to determine the plate quality and developer activity are identical with these of the above given load tests.

These tests provide the following results: At a replenishment rate of 40 mL/m², the electrical conductivity parameter remained constant. The activity of the developer, however, decreased with the number of loaded plates leading to an unacceptable plate quality, see Table 3 below.

TABLE 3

| Through-put (m²/L) | Replenisher composition (mL/m²) | Optical Density (95% dot) | Optical Density (50% dot) | Electrical conductivity (mS/cm) | Titration (mL 0.5 N HCl) |
|---|---|---|---|---|---|
| 0 |  | 96 | 49 | 89.0 | 8.9 |
| 2 | 40 | 96 | 50 | 88.9 | 8.7 |
| 4 | 40 | 95 | 51 | 89.2 | 8.5 |
| 6 | 40 | 96 | 52 | 89.3 | 8.4 |
| 8 | 40 | 97 | 50 | 89.2 | 8.2 |
| 10 | 40 | 96 | 52 | 89.1 | 8.0 |
| 12 | 40 | 97 | 51 | 89.2 | 7.9 |
| 14 | 40 | 97 | 52 | 89.3 | 7.7 |
| 16 | 40 | 98 | 52 | 89.1 | 7.5 |
| 18 | 40 | 98 | 53 | 89.3 | 7.4 |
| 20 | 40 | 99 | 53 | 89.2 | 7.2 |

At a replenishment rate of 50 mL/m², the activity of the developer remained constant. The electrical conductivity

TABLE 4

| Through-put (m²/L) | Replenisher composition (mL/m²) | Optical Density (95% dot) | Optical Density (50% dot) | Electrical conductivity (mS/cm) | Titration (mL 0.5 N HCl) |
|---|---|---|---|---|---|
| 0 |  | 95 | 48 | 89.1 | 8.8 |
| 2 | 50 | 96 | 47 | 90.7 | 8.6 |
| 4 | 50 | 95 | 47 | 92.0 | 8.7 |
| 6 | 50 | 95 | 49 | 93.1 | 8.6 |
| 8 | 50 | 96 | 47 | 94.6 | 8.5 |
| 10 | 50 | 96 | 48 | 95.5 | 8.4 |
| 12 | 50 | 95 | 47 | 96.9 | 8.6 |
| 14 | 50 | 95 | 49 | 98.3 | 8.5 |
| 16 | 50 | 96 | 47 | 99.5 | 8.4 |
| 18 | 50 | 95 | 49 | 101.2 | 8.5 |
| 20 | 50 | 96 | 47 | 102.9 | 8.6 |

These tests show that determination of the developer activity by means of electrical conductivity is only possible if a sufficient amount of electrical conductivity suppressing agent is present in the replenisher composition.

Comparative Example 4

ELECTRA® plates were developed in the same manner as described above in Example 3 by using developer 3. At a replenishment rate of 50 mL/m² of the comparative replenisher composition 2 the measured electrical conductivity continually increased while the activity of the developer bath remained constant.

Example 5

ELECTRA® plates were developed in the same manner as described above in Example 3 by using developer 3. At a replenishment rate of 50 mL/m² of the replenisher composition 1 the measured electrical conductivity as well as the activity of the developer bath remained constant.

Example 6

ELECTRA® plates were developed in the same manner as described above in Example 3 by using developer 3. At a replenishment rate of 50 mL/m² of Replenisher Composition 2, the measured electrical conductivity as well as the activity of the developer bath remained constant.

Having described the invention, we now claim the following and their equivalents.

What is claimed is:

1. A method for developing radiation-sensitive imagewise exposed devices by using an alkaline developer having electrical conductivity, the method comprising the steps of:
    (A) placing the exposed devices in the alkaline developer and removing the devices after a predetermined dwell time; and
    (B) correlating the activity of the developer with unit throughput by:
        (a) measuring the activity and electrical conductivity of the developer as a function of the unit throughput of the exposed device;
        (b) determining the amount of hydroxide ions per unit throughput necessary to maintain the original activity of the developer; and
        (c) determining the amount of a electrical conductivity suppressing agent per unit throughput necessary to keep the electrical conductivity constant; and
    (C) adding the replenisher composition to the developer and maintaining a desired activity;
    in which:
        the replenisher composition comprises water, a hydroxide ion source, and the electrical conductivity suppressing agent;
        the devices comprise a radiation-sensitive layer; and
        the electrical conductivity suppressing agent is water soluble, does not react with the other components of the replenisher composition and the developer, and does not react with or attack the radiation-sensitive layer of the device.

2. The method of claim 1 additionally comprising the step of:
    (D) repeating step (C) at least once.

3. The method of claim 1 in which a constant amount of replenisher composition is added to the developer per unit throughput of device.

4. The method of claim 2 in which the device is an imagewise exposed lithographic printing plate precursor.

5. The method of claim 4 in which the alkalinity and the amount of the electrical conductivity suppressing agent in the replenisher composition is such that the alkalinity and the conductivity of the developer can be kept essentially constant by the addition of 30 mL to 60 mL of replenisher composition per unit throughput of lithographic printing plate precursor to the developer.

6. The method of claim 5 in which the hydroxide ion source is at least one component selected from the group consisting of alkali metal hydroxides, alkali metal metasilicate, water glass and alkali metal phosphates.

7. The method of claim 6 in which the replenisher composition comprises at least one component selected from the group consisting of phosphonic acids and derivatives thereof, surfactants, polyglycols, anti-foaming agents, chelating agents and biocides.

8. The method of claim 7 in which the electrical conductivity suppressing agent is selected from the group consisting of diols, mono- or diethers of diols, esters of diol monoethers, ketones substituted with at least one hydroxy group or alkoxy group, ethers, alkanol amines, alkanols, and amides of organic acids.

9. The method of claim 8 in which the electrical conductivity suppressing agent is selected from the group consisting of ethylene glycol, hexylene glycol, diethylene glycol, polyethylene glycol, polypropylene glycol, hexane-1,6-diol, iso-propyl alcohol, monoethanol amine, methoxy acetone, 1,2-dimethoxy ethane, 1,4-dioxane, 2-methoxy ethyl acetate, and dimethyl formamide.

10. The method of claim 9 in which the amount of electrical conductivity suppressing agent in the replenisher composition is in the range from about 2 wt % to about 15 wt % based on the total weight of the composition.

11. The method of claim 10 in which the alkalinity of the replenisher composition is 1.2 to 1.6 times as high as that of the developer.

12. The method of claim 11 in which the electrical conductivity of the replenisher composition os 1.1 to 1.5 times as high as that of the developer.

13. The method of claim 1 in which:
    (a) the hydroxide ion source is selected from the group consisting of alkali metal hydroxides and water glass; and
    (b) the replenisher composition comprises:
        at least one phosphonic acid derivative selected from the group consisting of hydroxyethanediphosphonic acid, aminotri(methylenephosphonic acid), hexamethylenediaminotetra(methylenephosphonic acid), sodium salts thereof, and mixtures thereof;
        at least one polyglycol derivative selected from polypropylene glycol ether, polyethylene glycol ether, polybutylene glycol ether, derivatives thereof, and mixtures thereof; and
        8–15 wt %, based on the total weight of the replenisher composition, of the electrical conductivity suppressing agent, in which the electrical conductivity suppressing agent is selected from the group consisting of ethylene glycol, hexane-1,6-diol, diacetone alcohol, and mixtures thereof.

14. The method of claim 1 wherein the desired activity provides a constant developing result.

15. The method of claim 14 wherein the desired activity is an original activity.

16. The method of claim 13 wherein the desired activity provides a constant developing result.

17. The method of claim 16 wherein the desired activity is an original activity.

* * * * *

UNITED STATES PATENT AND TRADEMARK OFFICE
CERTIFICATE OF CORRECTION

PATENT NO. : 6,569,609 B2
DATED : May 27, 2003
INVENTOR(S) : Timpe et al.

It is certified that error appears in the above-identified patent and that said Letters Patent is hereby corrected as shown below:

Column 15,
Line 28, after the word "adding" and before the word "replenisher" delete "the" and insert -- a --

Column 16,
Line 27, delete "os" and insert therefore -- is --

Signed and Sealed this

Twelfth Day of August, 2003

JAMES E. ROGAN
*Director of the United States Patent and Trademark Office*